United States Patent
Choi et al.

(10) Patent No.: US 10,966,328 B2
(45) Date of Patent: Mar. 30, 2021

(54) DISPLAY APPARATUS AND METHOD OF MANUFACTURING THE SAME

(71) Applicant: SAMSUNG DISPLAY CO., LTD., Yongin-si (KR)

(72) Inventors: Sung Chui Choi, Hwaseong-si (KR); Han Sun Ryou, Seoul (KR); Mansik Myeong, Seoul (KR); Dongwoo Seo, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/395,050

(22) Filed: Apr. 25, 2019

(65) Prior Publication Data
US 2019/0357366 A1 Nov. 21, 2019

(30) Foreign Application Priority Data
May 18, 2018 (KR) .................... 10-2018-0057448

(51) Int. Cl.
| | |
|---|---|
| *G06F 1/16* | (2006.01) |
| *H05K 5/00* | (2006.01) |
| *H01L 51/52* | (2006.01) |
| *H01L 51/56* | (2006.01) |
| *B32B 7/12* | (2006.01) |
| *B32B 3/26* | (2006.01) |
| *H04B 1/3827* | (2015.01) |

(52) U.S. Cl.
CPC .......... *H05K 5/0017* (2013.01); *B32B 3/263* (2013.01); *B32B 7/12* (2013.01); *H01L 51/5253* (2013.01); *H01L 51/56* (2013.01); *B32B 2457/206* (2013.01); *H01L 2251/5338* (2013.01); *H04B 1/3827* (2013.01)

(58) Field of Classification Search
CPC ..................................................... H05K 1/028
See application file for complete search history.

(56) References Cited

U.S. PATENT DOCUMENTS

| | | | |
|---|---|---|---|
| 2016/0209874 A1* | 7/2016 | Choi ..................... | G06F 1/1652 |
| 2018/0150108 A1* | 5/2018 | Song ..................... | H05K 1/028 |

FOREIGN PATENT DOCUMENTS

| | | |
|---|---|---|
| KR | 10-2014-0014669 | 2/2014 |
| KR | 10-2014-0142004 | 12/2014 |
| KR | 10-2017-0064453 | 6/2017 |

* cited by examiner

*Primary Examiner* — Jerry Wu
(74) *Attorney, Agent, or Firm* — Lewis Roca Rothgerber Christie LLP

(57) ABSTRACT

A display apparatus includes: a flexible display panel including a first display area, a second display area which is spaced apart from the first display area, and a folding area between the first display area and the second display area; a first supporting part under the flexible display panel corresponding to the first display area; a second supporting part under the flexible display panel corresponding to the second display area; and a first adhesive layer between the flexible display panel and the first and second supporting parts in the first display area, the second display area, and the folding area, and attached to the first and second supporting parts.

20 Claims, 9 Drawing Sheets

DISPLAY APPARATUS AND METHOD OF MANUFACTURING THE SAME

CROSS-REFERENCE TO RELATED APPLICATION

This application claims priority to and the benefit of Korean Patent Application No. 10-2018-0057448, filed on May 18, 2018 in the Korean Intellectual Property Office, the entire content of which is herein incorporated by reference.

BACKGROUND

1. Field

Aspects of embodiments of the present inventive concept relate to a display apparatus and a method of manufacturing a display apparatus.

2. Description of the Related Art

Recently, a foldable display apparatus using a flexible display panel that can be bent is being developed. The display apparatus can be easily carried when folded and can realize a large screen when opened. Therefore, the display apparatus can be applied not only to mobile devices, such as a mobile phone, an ultra-mobile PC, an electronic book, and an electronic newspaper, but also to various fields, such as a television and a monitor.

The display apparatus requires a supporting portion (a jig plate) for supporting the flexible display panel. When the supporting portion (the jig plate) is rigid, the flexible display panel and the supporting portion should not be bonded at a bent portion of the display panel. As a result, there is a problem that the flexible display panel may be bent when the display apparatus is unfolded, and the display quality is lowered.

SUMMARY

According to an aspect of embodiments of the present inventive concept, a foldable display apparatus of an in-fold type and a method of manufacturing a display apparatus are provided. According to an aspect of embodiments of the present inventive concept, a display apparatus is foldable and capable of improving display quality and simplifying a manufacturing process.

According to an aspect of embodiments of the present inventive concept, a method of manufacturing a display apparatus that is foldable and capable of improving display quality and simplifying a manufacturing process is provided.

According to one or more embodiments of the inventive concept, a display apparatus includes: a flexible display panel comprising a first display area, a second display area which is spaced apart from the first display area, and a folding area between the first display area and the second display area; a first supporting part under the flexible display panel corresponding to the first display area; a second supporting part under the flexible display panel corresponding to the second display area; and a first adhesive layer between the flexible display panel and the first and second supporting parts in the first display area, the second display area, and the folding area, and attached to the first and second supporting parts.

In an example embodiment, the first adhesive layer may include one adhesive sheet corresponding to the first display area, the folding area, and the second display area of the flexible display panel.

In an example embodiment, an upper surface of the first supporting part may include a first non-attachment area which is not bonded to the first adhesive layer, and an upper surface of the second supporting part may include a second non-attachment area which is not bonded to the first adhesive layer.

In an example embodiment, the first and second non-attachment areas may be formed by surface treatment on the upper surfaces of the first and second support portions.

In an example embodiment, the surface treatment may include olefin treatment, silicon treatment, long chain alkyl treatment, or fluorine treatment.

In an example embodiment, a recess may be formed at the first supporting part in the first non-attachment area, and a first non-attachment part may be received in the recess. A recess may be formed at the second supporting part in the second non-attachment area, and a second non-attachment part may be received in the recess. The upper surface of the first supporting part and an upper surface of the first non-attachment part may be on a same plane. The upper surface of the second supporting part and an upper surface of the second non-attachment part may be on a same plane.

In an example embodiment, a portion of the first adhesive layer corresponding to the folding area of the flexible display panel may have a lower adhesive force than a portion of the first adhesive layer corresponding to the first or second display areas.

In an example embodiment, the first adhesive layer may include a pressure sensitive adhesive sheet including a UV-reactive agent.

In an example embodiment, an image may be displayed in both the first display area, the second display area, and the folding area, and the folding area may be foldable.

In an example embodiment, the first adhesive layer corresponding to the folding area may be spaced apart from the first and second supporting parts when the flexible display panel is folded.

In an example embodiment, the display apparatus may further include a non-attachment supporting part arranged corresponding to the folding area. The first supporting part and the second supporting part may be arranged corresponding to the first display area and the second display area, respectively. The non-attachment supporting part may contact the first adhesive layer when the flexible display panel is unfolded. The non-attachment supporting part may be spaced apart from the first adhesive layer when the flexible display panel is folded.

In an example embodiment, the display apparatus may further include a cushion layer between the first adhesive layer and the flexible display panel, and a second adhesive layer between the cushion layer and the flexible display panel.

In an example embodiment, the first adhesive layer may include an adhesive having an elongation percentage of 100% to 1,000%.

According to one or more embodiments of the inventive concept, a display apparatus includes: a flexible display panel which is foldable; a first supporting part attached to the flexible display panel; a second supporting part which is attached to the flexible display panel and is movable relative to the first supporting part as the flexible display panel is folded; and a first adhesive layer between the flexible display panel and the first and second supporting parts.

In an example embodiment, the first and second supporting parts may make contact with the first adhesive layer when the flexible display panel is unfolded, and a portion of the first supporting part and a portion of the second supporting part may be spaced apart from the first adhesive layer when the flexible display panel is folded.

In an example embodiment, an upper surface of the first supporting part may include a first non-attachment area which is not bonded to the first adhesive layer, and an upper surface of the second supporting part may include a second non-attachment area which is not bonded to the first adhesive layer.

In an example embodiment, a portion of the first adhesive layer corresponding to the portions of the first and second supporting parts spaced apart from the first adhesive layer may have a lower adhesive force than other portions of the first adhesive layer.

According to one or more embodiments of the inventive concept, a method of manufacturing a display apparatus includes: providing first and second supporting parts; providing a flexible display panel comprising a first display area, a second display area which is spaced apart from the first display area, and a folding area between the first display area and the second display area, wherein a first adhesive layer is attached thereon; and attaching the first adhesive layer to upper surfaces of the first and second supporting parts, and the first adhesive layer is arranged corresponding to the first display area, the second display area, and the folding area.

In an example embodiment, the method may further include performing a surface treatment to portions of the upper surfaces of the first and second supporting parts, and the surface treatment may include olefin treatment, silicon treatment, long chain alkyl treatment, or fluorine treatment.

In an example embodiment, the first adhesive layer may include a UV-reactive agent, and the method may further include irradiating UV light to a portion of the first adhesive layer.

According to an aspect of embodiments of the present inventive concept, a flexible display panel includes: a first display area, a second display area which is spaced apart from the first display area, and a folding area disposed between the first display area and the second display area; a first supporting part disposed under the flexible display panel corresponding to the first display area; a second supporting part disposed under the flexible display panel corresponding to the second display area; and a first adhesive layer disposed between the flexible display panel and the first and second supporting parts in the first display area, the second display area, and the folding area, and attached to the first and second supporting parts.

Accordingly, even when the display apparatus is unfolded, a stepped portion between the folding area and the first and second display areas may not be formed, and deterioration of display quality due to bending of the flexible display panel may be prevented or substantially prevented.

According to an aspect, the first adhesive layer may be formed as one adhesive sheet over the first display area, the second display area, and the folding area. Accordingly, working efficiency may be improved and an alignment problem may be avoided.

According to a method of manufacturing a display apparatus, the non-attachment area corresponding to the folding area may be formed by surface treatment on the upper surfaces of the first and second supporting parts or formed by the after-treatment to the portion of the first adhesive layer. Since the first adhesive layer is formed in one configuration over the first and second display areas and the folding area, the display apparatus can be easily manufactured by a simple attaching operation without a separate alignment operation or the like.

It is to be understood that both the foregoing general description and the following detailed description are exemplary and explanatory and are intended to provide further explanation of the invention as claimed.

BRIEF DESCRIPTION OF THE DRAWINGS

The above and other features of the inventive concept will become more apparent by describing in further detail some example embodiments thereof with reference to the accompanying drawings, in which.

DETAILED DESCRIPTION

Herein, the inventive concept will be explained in further detail with reference to the accompanying drawings.

Figure 1:
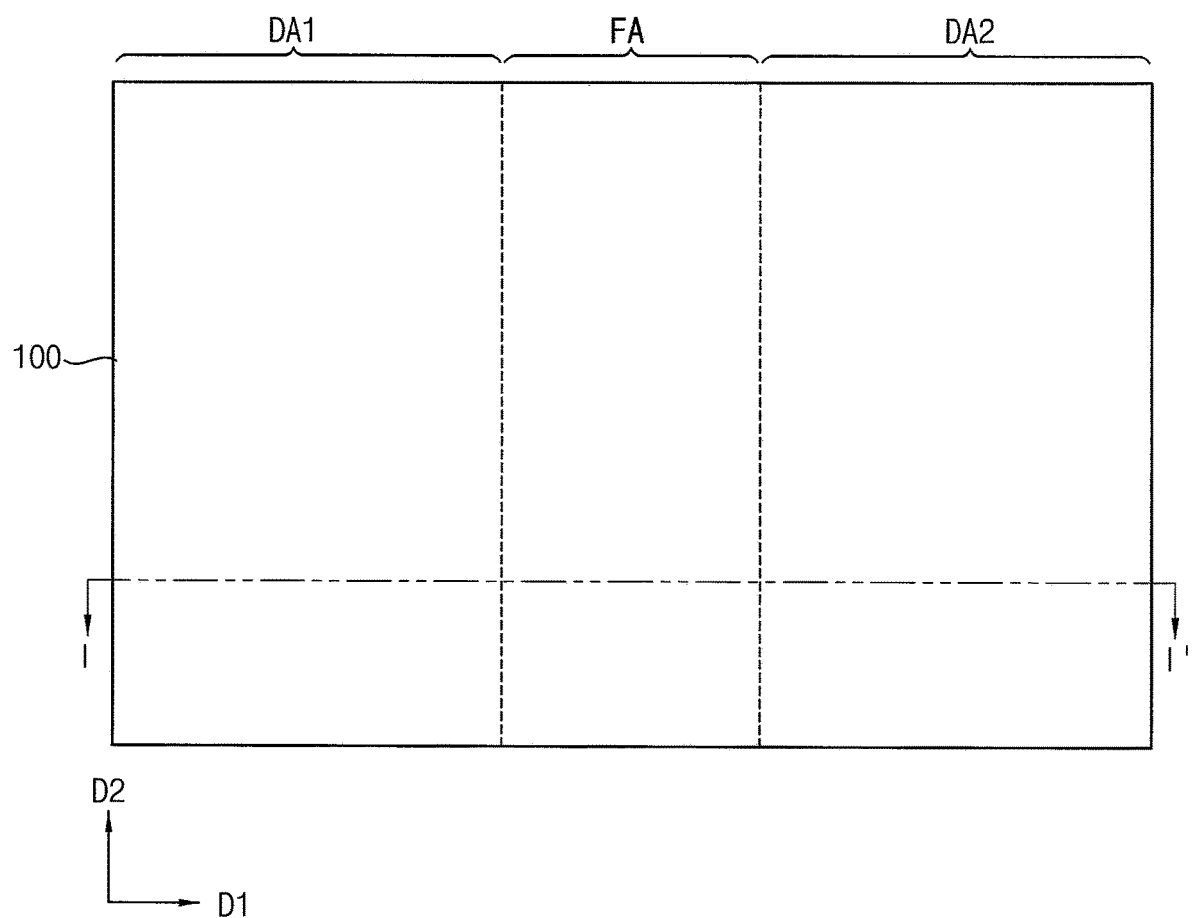
FIG. 1 is a plan view illustrating a display apparatus according to an example embodiment of the inventive concept.
Figure 2:
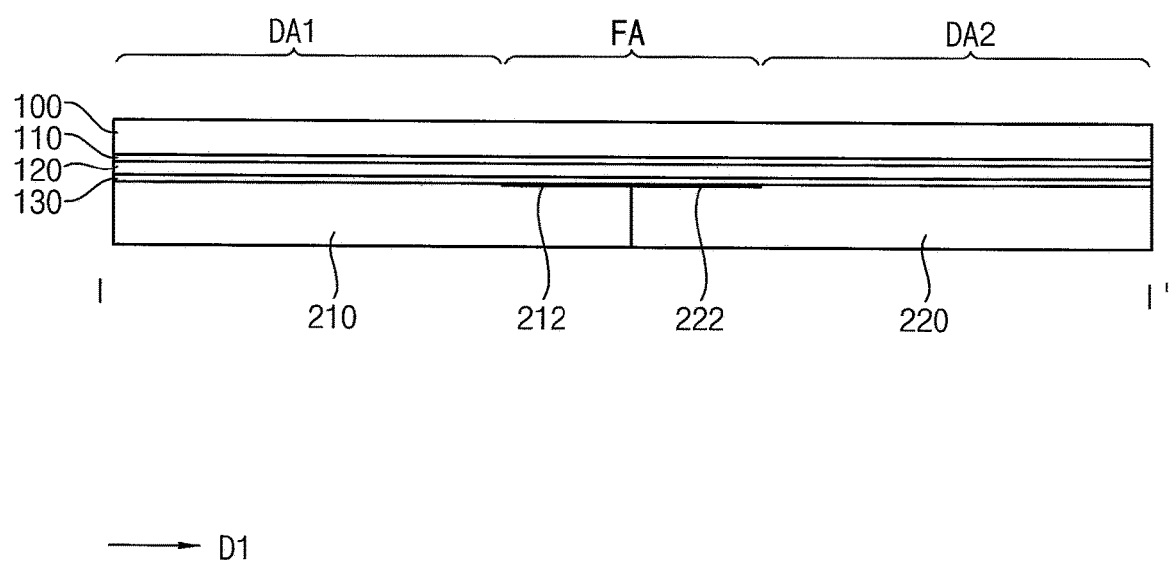
FIG. 2 is a cross-sectional view taken along the line I-I' of FIG. 1.

FIG. 1 is a plan view illustrating a display apparatus according to an example embodiment of the inventive concept; FIG. 2 is a cross-sectional view taken along the line I-I' of FIG. 1; and FIG. 3 is a cross-sectional view of the display apparatus of FIG. 2, shown in a state in which the display apparatus is folded.

Figure 3:
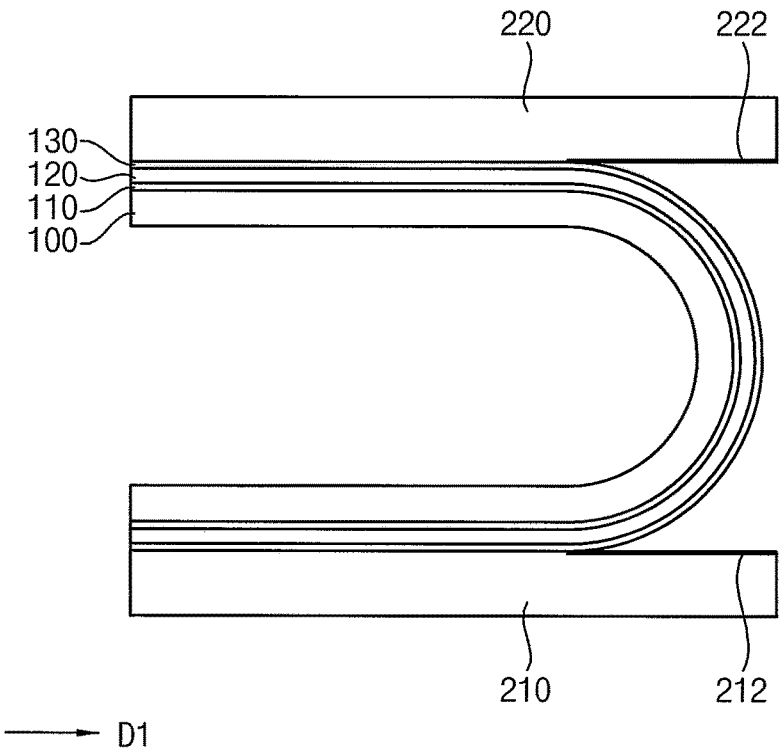
FIG. 3 is a cross-sectional view of the display apparatus of FIG. 2, shown in a state in which the display apparatus is folded.

Referring to FIGS. 1 to 3, the display apparatus may include a first supporting part 210, a second supporting part 220, a first adhesive layer 130, a cushion layer 120, a second adhesive layer 110, and a flexible display panel 100. FIGS. 1 and 2 are a plan view and a cross-sectional view of the display apparatus in an unfolded state; and FIG. 3 is a cross-sectional view of the display apparatus in a folded state.

The flexible display panel 100 may include a flexible substrate, such as a polyimide (PI) film, a plastic film, or the like. The flexible display panel 100 may further include an organic light emitting diode and pixels disposed on the flexible substrate to display an image. The organic light emitting diode and the pixels may be covered with a thin film encapsulation layer. The thin film encapsulation layer may seal the organic light emitting diode from an ambient environment including moisture and oxygen to suppress deterioration of characteristics.

A transparent cover window may be provided outside a display surface of the flexible display panel 100. The cover window may protect the flexible display panel 100 from external impacts and scratches while allowing the image of the flexible display panel 100 to pass through. In addition, a touch screen panel may be disposed between the flexible display panel 100 and the cover window to detect a user's touch operation.

The flexible display panel 100 is a flexible panel capable of displaying an image. The flexible display panel 100 may be realized by any of a liquid crystal display device (LCD), a plasma display panel device (PDP), a field emission display device (FED), an electroluminescence display device (ELD), and the like, as well as an organic light emitting display panel including the organic light emitting diode as described above.

In an embodiment, the flexible display panel 100 may include a first display area DA1, a second display area DA2, and a folding area FA.

The flexible display panel 100 in FIG. 1 shows a state in which the display apparatus is unfolded. The first display area DA1 and the second display area DA2 may be disposed to be spaced apart from each other in a first direction D1 in a plane formed by the first direction D1 and a second direction D2 which is perpendicular to the first direction D1. The folding area FA, which is a bent area when the display apparatus is folded, may be disposed between the first display area DA1 and the second display area DA2. The flexible display panel 100 may display images in both the first display area DA1, the second display area DA2, and the folding area FA.

The second adhesive layer 110 may be disposed under the flexible display panel 100. Thus, the second adhesive layer 110 may be disposed between the flexible display panel 100 and the cushion layer 120. The second adhesive layer 110 may adhere the cushion layer 120 to the flexible display panel 100 and, in an embodiment, may include acrylic resin or silicone resin.

Since the display apparatus can be folded in the folding area FA, the second adhesive layer 110 may include an adhesive material having relatively high elongation percentage. For example, the second adhesive layer 110 may include an adhesive having an elongation percentage of 100% to 1,000%. The second adhesive layer 110 may have a predetermined viscosity, and, in an embodiment, the second adhesive layer 110 may be a pressure sensitive adhesive layer. For example, the second adhesive layer 110 may be formed of pressure sensitive adhesive (PSA).

The cushion layer 120 may be disposed under the second adhesive layer 110. Thus, the cushion layer 120 may be disposed between the second adhesive layer 110 and the first adhesive layer 130. In an embodiment, the cushion layer 120 may be formed of a foam material. For example, the cushion layer 120 may include any of polyurethane (PU), thermoplastic polyurethane (TPU), silicone, polydimethylacrylamide (PDMA), and the like.

The first adhesive layer 130 may be disposed under the cushion layer 120. Thus, the first adhesive layer 130 may be disposed between the cushion layer 120 and the first and second supporting parts 210 and 220. The first adhesive layer 130 may adhere the first and second supporting parts 210 and 220 to the cushion layer 120 and, in an embodiment, may include acrylic resin or silicone resin.

Since the display apparatus can be folded in the folding area FA, the first adhesive layer 130 may include an adhesive material having relatively high elongation percentage. For example, the first adhesive layer 130 may include an adhesive having an elongation percentage of 100% to 1,000%. The first adhesive layer 130 may have a predetermined viscosity, and, in an embodiment, the first adhesive layer 130 may be a pressure sensitive adhesive layer. For example, the first adhesive layer 130 may be formed of pressure sensitive adhesive (PSA).

In an embodiment, the first adhesive layer 130 may be formed as one layer over the first display area DA1, the second display area DA2, and the folding area FA. That is, the first adhesive layer 130 may be formed by attaching an adhesive sheet corresponding to the entire flexible display panel 100 to the cushion layer 120. In an embodiment, the second adhesive layer 110 may be attached to the flexible display panel 100 after the first adhesive layer 130, the cushion layer 120, and the second adhesive layer 110 are attached to each other. In an embodiment, since the first adhesive layer 130 is formed as one layer over the first display area DA1, the second display area DA2, and the folding area FA, there is no stepped portion formed by the first adhesive layer 130. According to the present embodiment, compared to a case in which a plurality of adhesive tapes are attached to the folding area and the unfolding area of the flexible display panel 100 separately, working efficiency may be improved and an alignment problem may be avoided.

Here, the first adhesive layer 130 may be disposed between the flexible display panel 100 and the first and second supporting parts 210 and 220, may be disposed in the first display area DA1, the second display area DA2, and the folding area FA of the flexible display panel 100, and may be attached to the first and second supporting parts 210 and 220.

For example, the first adhesive layer 130 may be an integrally formed adhesive sheet corresponding to the first display area DA1, the folding area FA, and the second display area DA2 of the flexible display panel 100.

The first supporting part 210 and the second supporting part 220 may be disposed under the first adhesive layer 130. The first supporting part 210 may be adhered to the first adhesive layer 130 corresponding to the first display area DA1, and fixed to the flexible display panel 100. The second supporting part 220 may be adhered to the first adhesive layer 130 corresponding to the second display area DA2, and fixed to the flexible display panel 100.

In an embodiment, the first and second supporting parts 210 and 220 may be formed using a metal material, such as stainless steel (SUS), or a polymer material, such as polymethyl methacrylate, (PMMA), polycarbonate (PC), polyvinyl alcohol (PVA), acrylonitrile butadiene styrene (ABS), or polyethylene terephthalate (PET).

In the folding area FA, a top surface of the first supporting part 210 may include a first non-attachment area 212 that is not bonded to the first adhesive layer 130. In addition, a top surface of the second supporting part 220 may include a second non-attachment area 222 that is not bonded to the first adhesive layer 130.

The first and second non-attachment areas 212 and 222 are portions that are not bonded to the first adhesive layer 130. When the display apparatus is unfolded, the first and second non-attachment areas 212 and 222 make contact with the first adhesive layer 130 in the folding area FA, but are not bonded to the first adhesive layer 130. Thus, when the display apparatus is folded, the first and second non-attachment areas 212 and 222 can be easily separated from the first adhesive layer 130. Accordingly, even when the display apparatus is folded, the first and second non-attachment areas 212 and 222 are rigid (not bent), and may not affect a folding function of the display apparatus.

In an embodiment, the first and second non-attachment areas 212 and 222 may formed by surface-treatment on upper surfaces of the first and second supporting parts 210 and 220. In an embodiment, the surface-treatment may be a treatment for improving peelability with the first adhesive layer 130. The surface treatment is not particularly limited, but some examples include peeling treatment such as olefin treatment, silicon treatment, long chain alkyl treatment, and fluorine treatment. In an embodiment, an anti-fingerprint or the like may be used to form the first and second non-attachment areas 212 and 222.

For example, when the first adhesive layer 130 is an acrylic adhesive, the first and second non-attachment areas 212 and 222 may be formed by silicon treatment, and when the first adhesive layer 130 is a silicone adhesive, the first and second non-attachment areas 212 and 222 may be formed by an acrylic treatment.

According to the present embodiment, a flexible display panel includes a first display area, a second display area which is spaced apart from the first display area, and a folding area disposed between the first display area and the second display area, a first supporting part disposed under the flexible display panel corresponding to the first display area, a second supporting part disposed under the flexible display panel corresponding to the second display area, and a first adhesive layer disposed between the flexible display panel and the first and second supporting parts in the first display area, the second display area, and the folding area, and attached to the first and second supporting parts.

Accordingly, even when the display apparatus is unfolded, a stepped portion between the folding area and the first and second display areas may not be formed, and deterioration of display quality due to bending of the flexible display panel can be prevented or substantially prevented.

In an embodiment, the first adhesive layer may be formed as one adhesive sheet over the first display area, the second display area, and the folding area. Accordingly, working efficiency may be improved and an alignment problem may be avoided.

Figure 4:
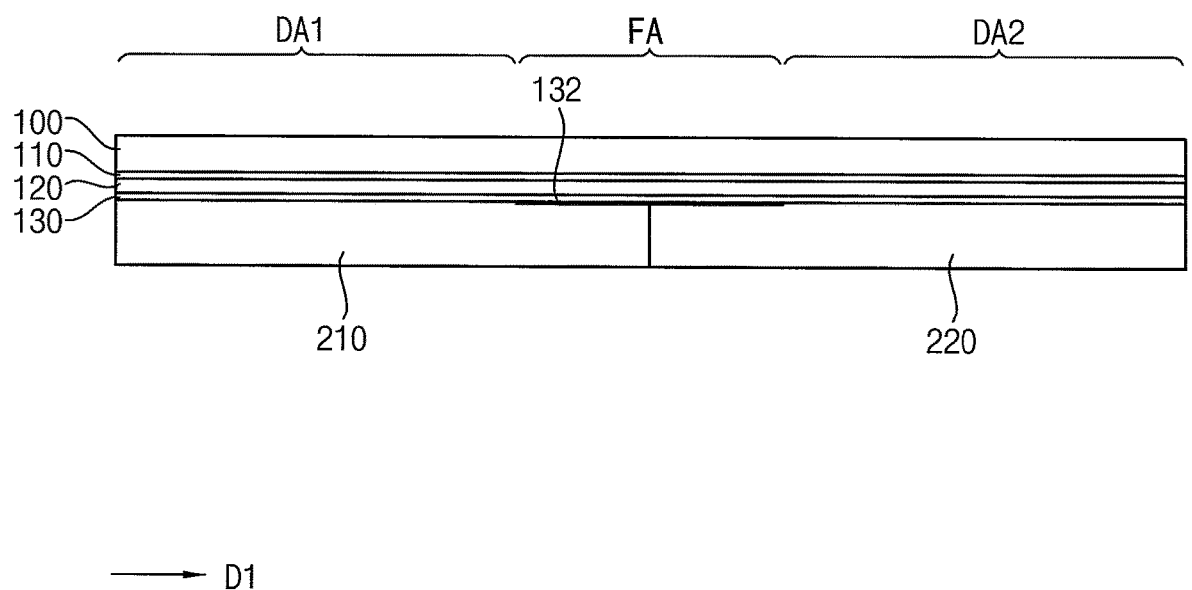
FIG. 4 is a cross-sectional view illustrating a display apparatus according to an example embodiment of the inventive concept.
Figure 5:
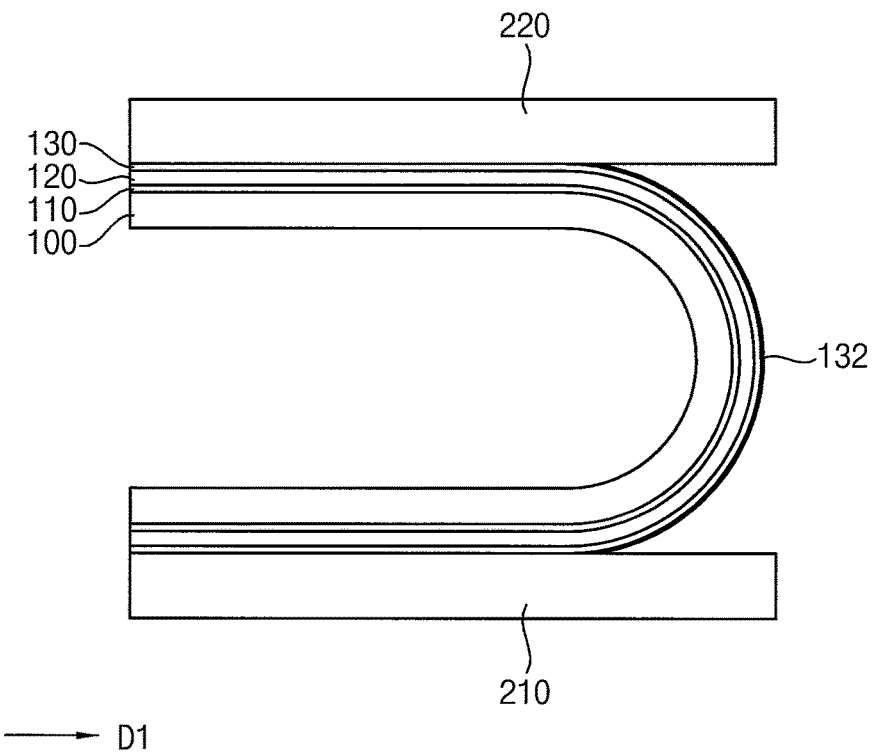
FIG. 5 is a cross-sectional view of the display apparatus of FIG. 4, shown in a state in which the display apparatus is folded.

FIG. 4 is a cross-sectional view illustrating a display apparatus according to an example embodiment of the inventive concept; and FIG. 5 is a cross-sectional view of the display apparatus of FIG. 4, shown in a state in which the display apparatus is folded.

Referring to FIGS. 4 and 5, the display apparatus may be substantially the same as the display apparatus of FIGS. 1 to 3 except that a non-attachment area is formed in a first adhesive layer instead of a supporting part. Therefore, repeated description of same components will be omitted.

The display apparatus may include a first supporting part 210, a second supporting part 220, a first adhesive layer 130, a cushion layer 120, a second adhesive layer 110, and a flexible display panel 100. FIG. 4 is a cross-sectional view of the display apparatus in an unfolded state; and FIG. 5 is a cross-sectional view of the display apparatus in a folded state.

A portion of the first adhesive layer 130 corresponding to a folding area FA of the flexible display panel 100 may have a lower adhesive force than a portion of the first adhesive layer 130 corresponding to the first or second display area DA1 or DA2. Thus, the first adhesive layer 130 may be formed with a non-attachment area 132 in the folding area FA. The non-attachment area 132 is in contact with the first and second supporting parts 210 and 220 when the display apparatus is unfolded, and can easily be separated or spaced apart from the first and second supporting parts 210 and 220 when the display apparatus is folded.

In an embodiment, the non-attachment area 132 of the first adhesive layer 130 may be formed by an after-treatment of the first adhesive layer 130. For example, the first adhesive layer 130 may be a pressure sensitive adhesive sheet including a UV-reactive agent. In an embodiment, the non-attachment area 132 having a lower adhesive force than the portion corresponding to the first or second display area DA1 or DA2 may be formed by irradiating ultraviolet rays to the folding area FA. According to another embodiment, the non-attachment area 132 may be formed by surface treatment of the portion of the first adhesive layer 130.

Figure 6:
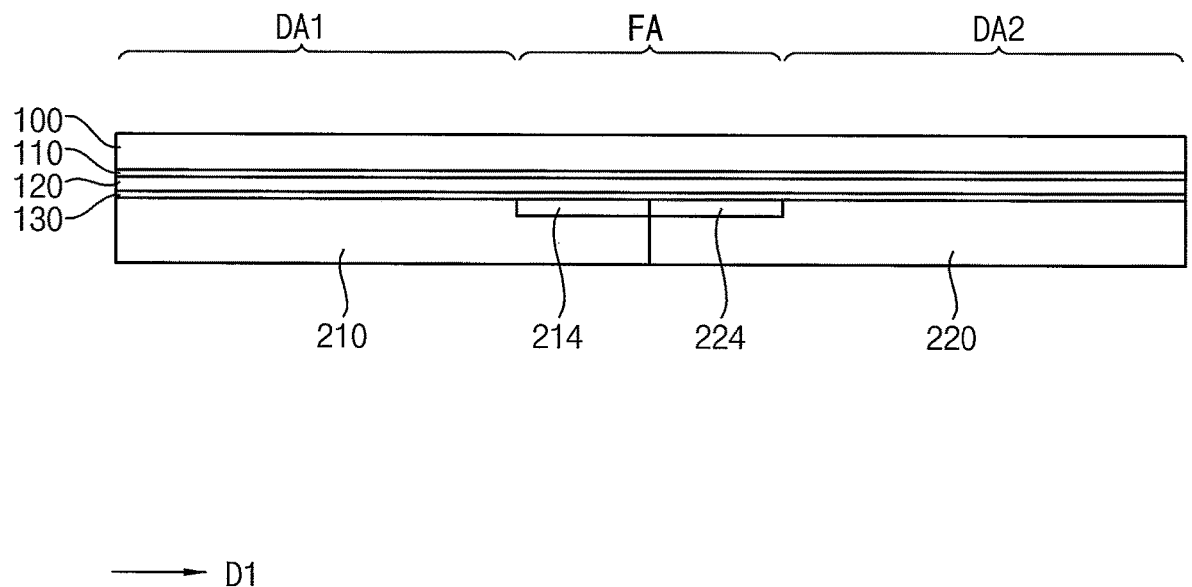
FIG. 6 is a cross-sectional view illustrating a display apparatus according to an example embodiment of the inventive concept.
Figure 7:
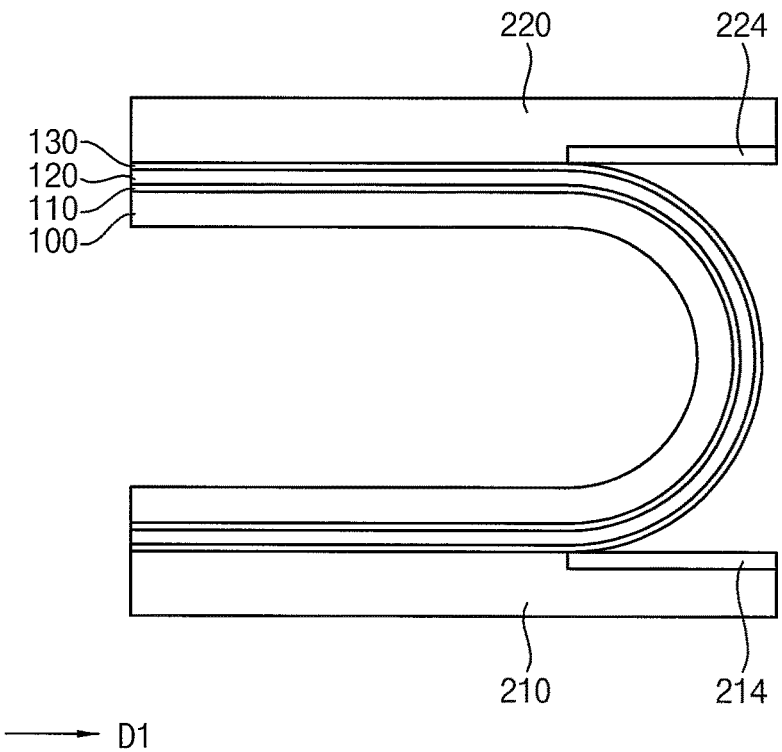
FIG. 7 is a cross-sectional view of the display apparatus of FIG. 6, shown in a state in which the display apparatus is folded.

FIG. 6 is a cross-sectional view illustrating a display apparatus according to an example embodiment of the inventive concept; and FIG. 7 is a cross-sectional view of the display apparatus of FIG. 6, shown in a state in which the display apparatus is folded.

Referring to FIGS. 6 and 7, the display apparatus may be substantially the same as the display apparatus of FIGS. 1 to 3 except that a non-attachment area is formed on a surface of a supporting part, but is formed of a separate member received in a recess of the supporting part. Therefore, repeated description of same components will be omitted.

The display apparatus may include a first supporting part 210, a first non-attachment part 214, a second supporting part 220, a second non-attachment part 224, a first adhesive layer 130, a cushion layer 120, a second adhesive layer 110, and a flexible display panel 100. FIG. 6 is a cross-sectional view of the display apparatus in an unfolded state; and FIG. 7 is a cross-sectional view of the display apparatus in a folded state.

A recess may be formed in a first non-attachment area of the first supporting part 210, and the first non-attachment part 214 may be received in the recess. Accordingly, an upper surface of the first supporting part 210 and an upper surface of the first non-attachment part 214 may be disposed on a same plane.

A recess may be formed in a second non-attachment area of the second supporting part 220, and the second non-attachment part 224 may be received in the recess. Accordingly, an upper surface of the second supporting part 220 and an upper surface of the second non-attachment part 224 may be disposed on a same plane.

In an embodiment, the first non-attachment part 214 and the second non-attachment part 224 may be formed by performing a surface treatment to improve peelability from adhesive on at least one surface of a base material, such as a synthetic resin film (e.g., polyethylene, polypropylene or polyester film), paper, non-woven fabric, cloth, foam sheet, or metal foil, or a laminate thereof. The surface treatment is not particularly limited, but some examples include peeling treatment such as olefin treatment, silicon treatment, long chain alkyl treatment, and fluorine treatment. In an embodiment, an anti-fingerprint or the like may be used to form the first non-attachment part 214 and the second non-attachment part 224.

Figure 8:
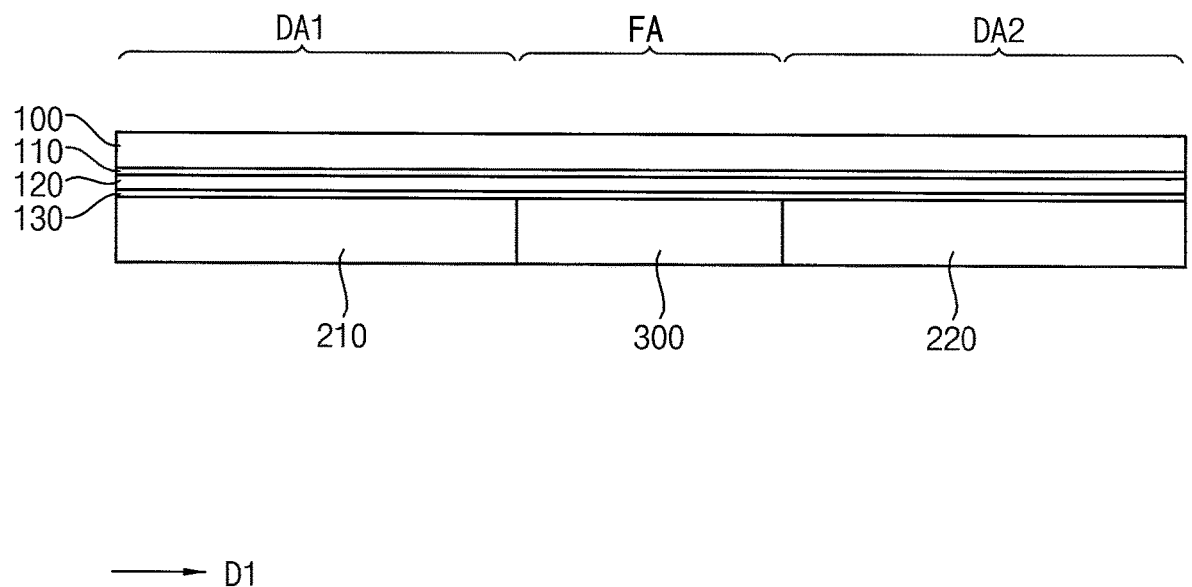
FIG. 8 is a cross-sectional view illustrating a display apparatus according to an example embodiment of the inventive concept.
Figure 9:
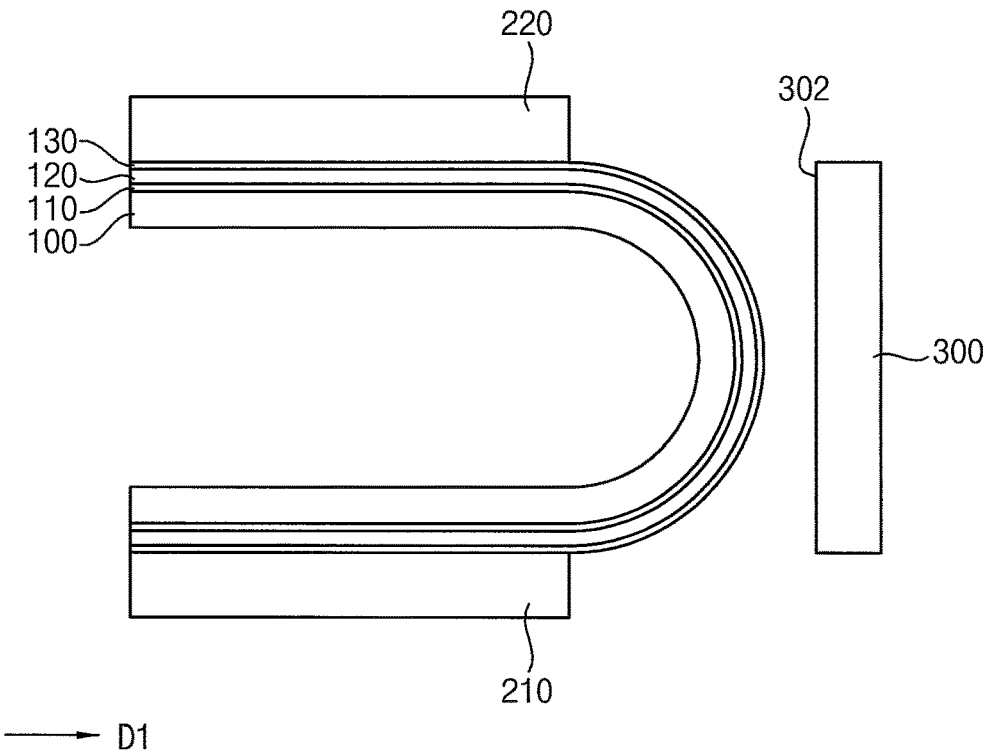
FIG. 9 is a cross-sectional view of the display apparatus of FIG. 8, shown in a state in which the display apparatus is folded.

FIG. 8 is a cross-sectional view illustrating a display apparatus according to an example embodiment of the inventive concept; and FIG. 9 is a cross-sectional view of the display apparatus of FIG. 8, shown in a state in which the display apparatus is folded.

Referring to FIGS. 8 and 9, the display apparatus may be substantially the same as the display apparatus of FIGS. 1 to 3 except that a non-attachment area is formed on a surface of the supporting part, but a separate non-attachment supporting part is formed. Therefore, repeated description of same components will be omitted.

The display apparatus may include a first supporting part 210, a second supporting part 220, a non-attachment supporting part 300, a first adhesive layer 130, a cushion layer 120, a second adhesive layer 110, and a flexible display panel 100. FIG. 8 is a cross-sectional view of the display apparatus in an unfolded state; and FIG. 9 is a cross-sectional view of the display apparatus in a folded state.

The non-attachment supporting part 300 may be disposed under the first adhesive layer 130 corresponding to the folding area FA. The first supporting part 210 and the second supporting part 220 may be disposed corresponding to the first display area DA1 and the second display area DA2.

In an embodiment, the non-attachment supporting part 300 may be fixed to a container of an electric device (for example, a smartphone, television, or the like) having the display apparatus, not be fixed to the flexible display panel 100, such that the non-attachment supporting part 300 is not bent even when the flexible display panel 100 is folded. The non-attachment supporting part 300 may make contact with the first adhesive layer 130 when the flexible display panel 100 is unfolded, and the non-attachment supporting part 300 may be spaced apart from the first adhesive layer 130 when the flexible display panel 100 is folded.

Figure 10A:
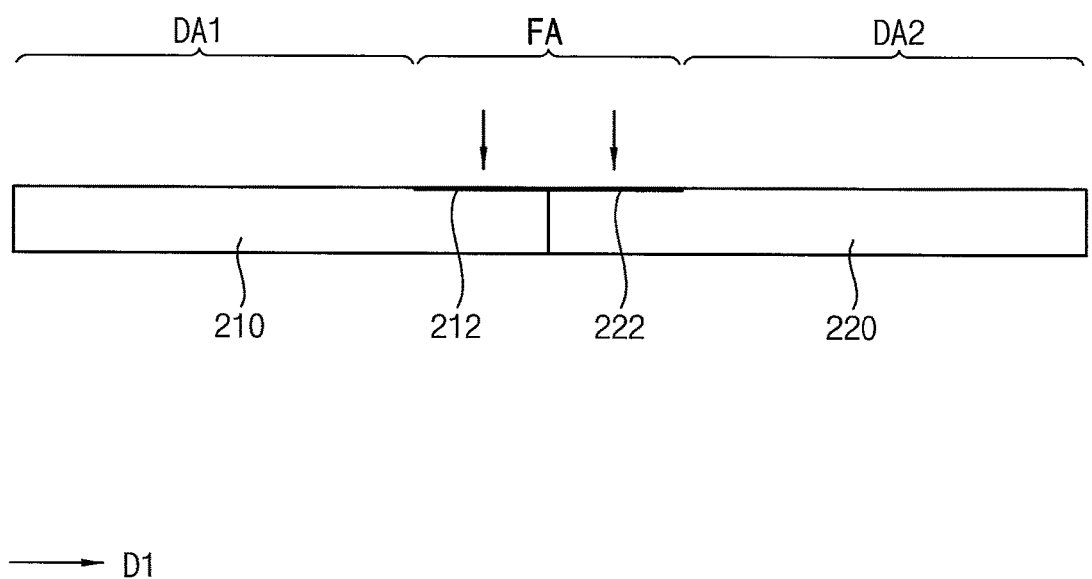
FIGS. 10A to 10C are cross-sectional views to explain a method of manufacturing the display apparatus of FIG. 2.
Figure 10B:
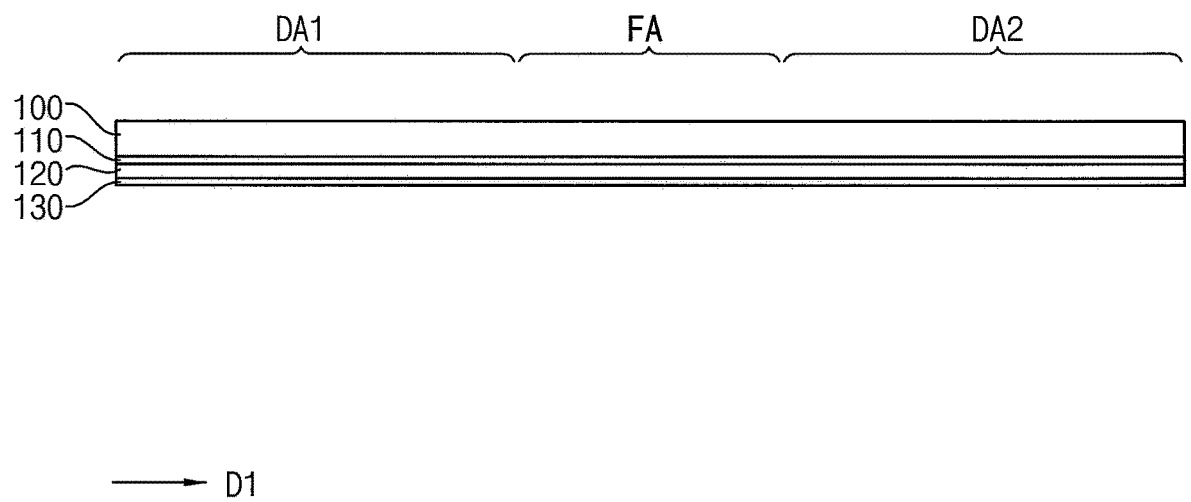
Figure 10C:
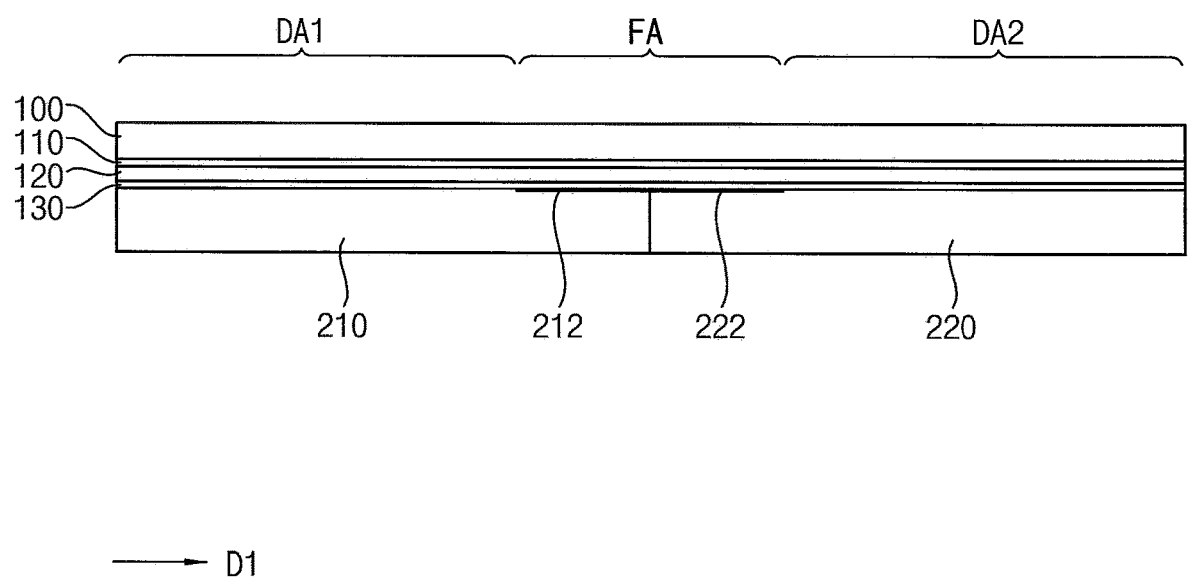

FIGS. 10A to 10C are cross-sectional views to explain a method of manufacturing the display apparatus of FIG. 2.

Referring to FIG. 10A, a first supporting part 210 and a second supporting part 220 may be provided. A first non-attachment area 212 and a second non-attachment area 222 may be formed by surface-treatment on an upper surface of the first supporting part 210 and the second supporting part 220, respectively. As described above, an example of the surface treatment may be a peeling treatment to improve peelability from a first adhesive layer, such as any of olefin treatment, silicon treatment, long chain alkyl treatment, and fluorine treatment. In an embodiment, an anti-fingerprint or the like may be used to form the first non-attachment area 212 and the second non-attachment area 222. Accordingly, the non-attachment area can be formed only in the folding area FA excluding the first and second display areas DA1 and DA2.

Referring to FIG. 10B, a first adhesive layer 130, a cushion layer 120, a second adhesive layer 110, and a flexible display panel 100 may be provided. The first adhesive layer 130, the cushion layer 120, and the second adhesive layer 110 may be attached to the flexible display panel 100, such as sequentially. However, an order of attaching the structures to each other is not limited thereto. For example, the first adhesive layer 130, the cushion layer 120, and the second adhesive layer 110 may be attached to each other, and then a surface of the second adhesive layer 110, which is opposite to a surface to which the cushion layer 120 is attached, may be attached to the flexible display panel 100, such that the first adhesive layer 130, the cushion layer 120, the second adhesive layer 110, and the flexible display panel 100 may be provided.

Referring to FIG. 10C, an opposite surface of the first adhesive layer 130 which is opposite to a surface of the first adhesive layer 130 to which the cushion layer 120 is attached, may be attached to the first and second supporting parts 210, 220. Thus, the display apparatus may be manufactured. Here, since the first and second non-attachment areas 212 and 222 are already formed on the upper surfaces of the first and second supporting parts 210 and 220, the first adhesive layer 130 may be simply attached to the first and second supporting parts 210 and 220 to manufacture the display apparatus. Thus, there is no need for alignment to install a separate member (for example, a step difference compensating member may be needed if the first adhesive layer were formed only in the first and second display areas and were not formed corresponding to the folding area), such that a manufacturing process is simplified and defects due to alignment errors may be prevented or substantially prevented.

In an embodiment, although the method of manufacturing the display apparatus of FIGS. 6 and 7 is not shown in detail, the display apparatus may be manufactured by attaching a non-attachment part to the recess after the recess is formed in the supporting part.

Figure 11A:
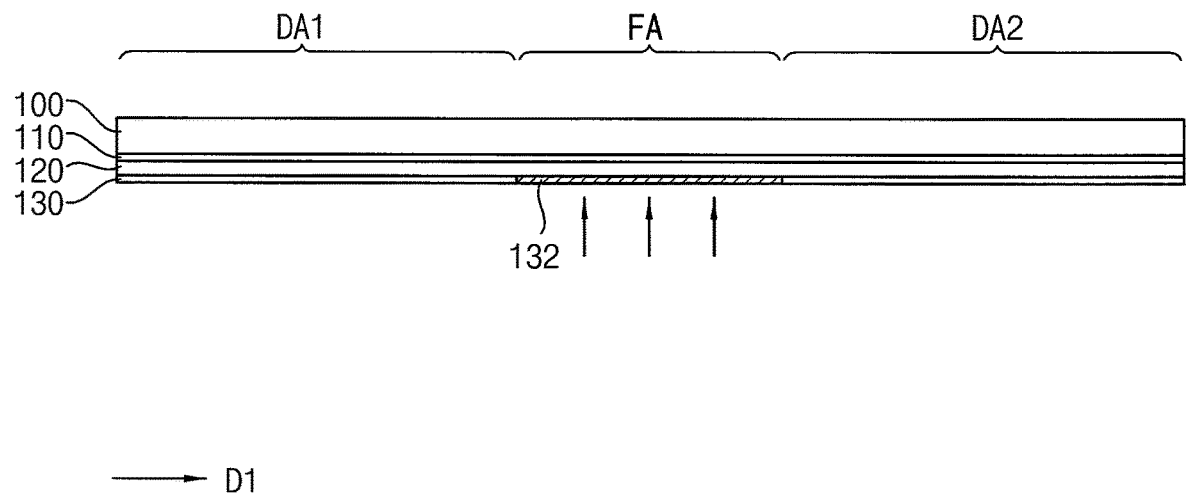
FIGS. 11A and 11B are cross-sectional views to explain a method of manufacturing the display apparatus of FIG. 4.
Figure 11B:
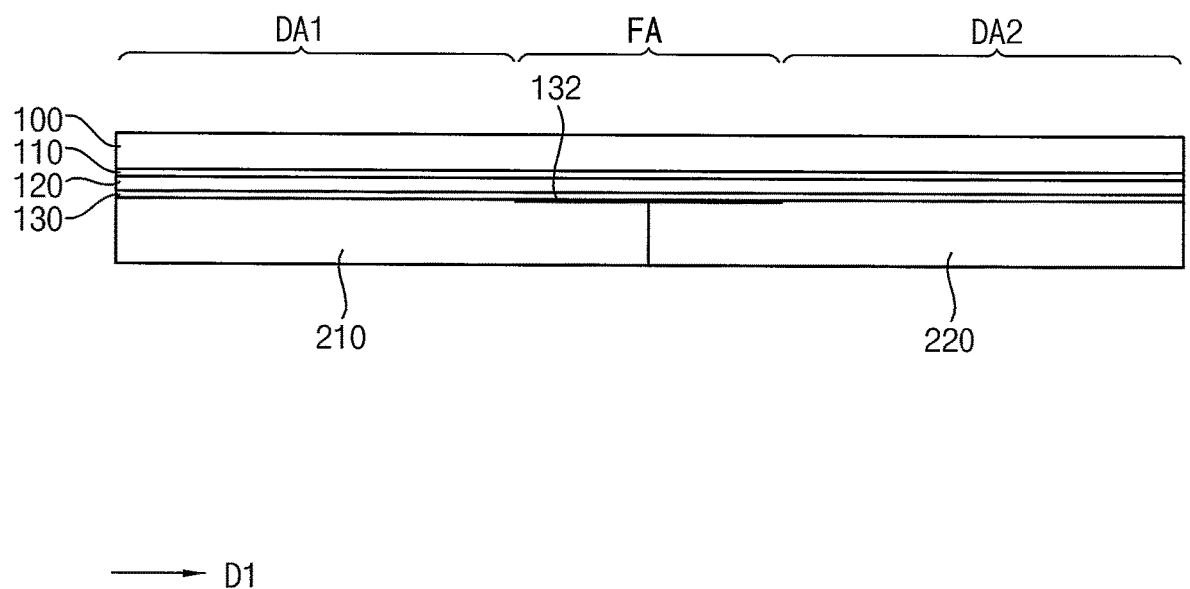

FIGS. 11A and 11B are cross-sectional views to explain a method of manufacturing the display apparatus of FIG. 4.

Referring to FIG. 11A, a first adhesive layer 130, a cushion layer 120, a second adhesive layer 110, and a flexible display panel 100 may be provided. In an embodiment, the first adhesive layer 130 may include a UV-reactive agent, and a non-attachment area 132 may be formed by irradiating UV light to a portion of the first adhesive layer 130. Thus, the folding area FA excluding the first display area DA1 and the second display area DA2 may be irradiated with ultraviolet light, such that an adhesive force of the portion of the first adhesive layer 130 corresponding to the folding region FA may be weakened to form the non-attaching region 132.

The first adhesive layer 130, the cushion layer 120, and the second adhesive layer 110 may be attached (e.g., sequentially attached) to the flexible display panel 100, and then the UV light may be irradiated. However, an order of attaching elements and irradiating UV light is not limited thereto. For example, the first adhesive layer 130, the cushion layer 120, and the second adhesive layer 110 may be attached to each other, then the UV light may be irradiated, and then the first adhesive layer 130 may be attached to the flexible display panel 100 to provide the first adhesive layer 130, the cushion layer 120, the second adhesive layer 110, and the flexible display panel 100.

Referring to FIG. 11B, an opposite surface of the first adhesive layer 130 which is opposite to a surface of the first adhesive layer 130 on which the cushion layer 120 is attached may be attached to the first and second supporting parts 210 and 220 to manufacture the display apparatus. Here, the non-attachment area 132 is already formed on the first adhesive layer 130, such that the display apparatus can be manufactured by merely attaching the first adhesive layer 130 on the first and second supporting portions 210 and 220.

According to the example embodiments of the present inventive concept, a flexible display panel includes a first display area, a second display area which is spaced apart from the first display area, and a folding area disposed between the first display area and the second display area, a first supporting part disposed under the flexible display panel corresponding to the first display area, a second supporting part disposed under the flexible display panel corresponding to the second display area, and a first adhesive layer disposed between the flexible display panel and the first and second supporting parts in the first display area, the second display area, and the folding area, and attached to the first and second supporting parts.

Accordingly, even when the display apparatus is unfolded, a stepped portion between the folding area and the first and second display areas may not be formed, and deterioration of display quality due to bending of the flexible display panel may be prevented or substantially prevented.

In an embodiment, the first adhesive layer may be formed as one adhesive sheet over the first display area, the second display area, and the folding area. Accordingly, working efficiency may be improved and an alignment problem may be avoided.

In an embodiment, according to a method of manufacturing the display apparatus, the non-attachment area corresponding to the folding area is formed by surface treatment on the upper surfaces of the first and second supporting parts or formed by an after-treatment to the portion of the first adhesive layer. Since the first adhesive layer is formed in one configuration over the first and second display areas and the folding area, the display apparatus can be easily manufactured by a simple attaching operation without a separate alignment operation or the like.

Figure 12A:
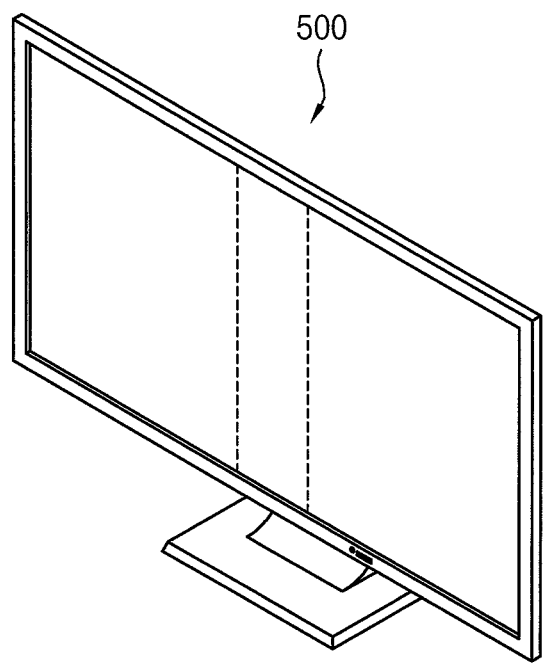
FIGS. 12A and 12B are diagrams illustrating an example in which an electronic device is implemented as a television, according to example embodiments.
Figure 12B:
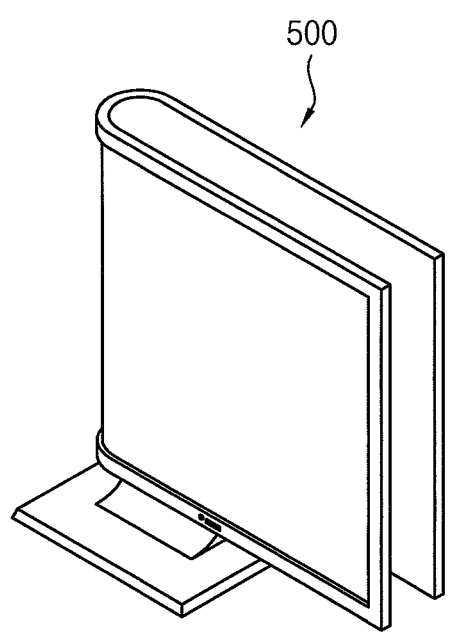
Figure 13A:
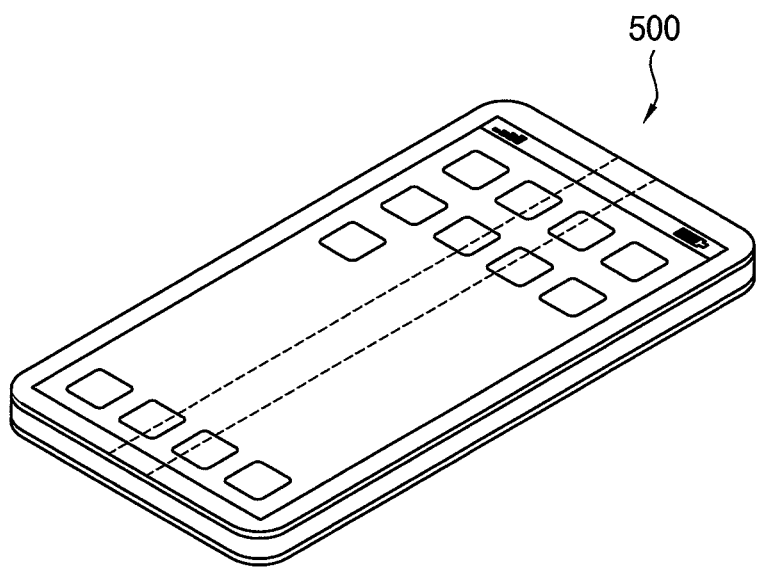
FIGS. 13A and 13B are diagrams illustrating an example in which an electronic device is implemented as a smartphone, according to example embodiments.
Figure 13B:
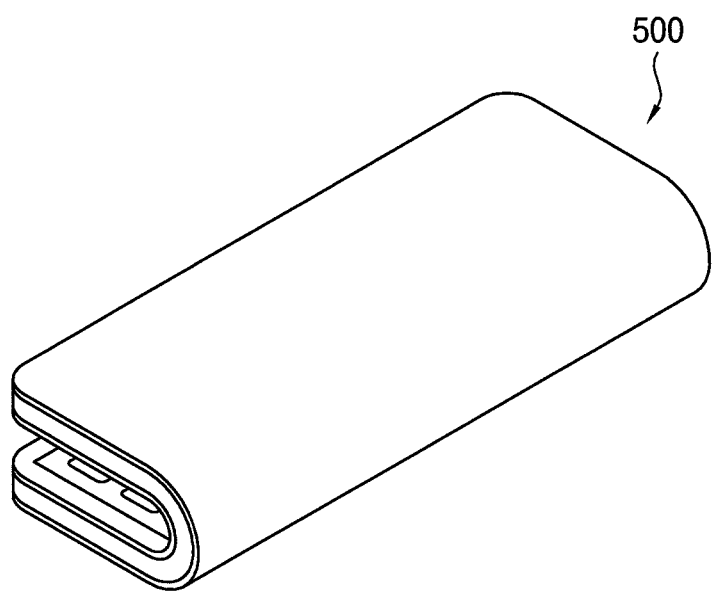

FIGS. 12A and 12B are diagrams illustrating an example in which an electronic device is implemented as a television, according to example embodiments; and FIGS. 13A and 13B are diagrams illustrating an example in which an electronic device is implemented as a smartphone, according to example embodiments.

FIG. 12A is a view showing a state in which the television is unfolded; and FIG. 12B is a view showing a state in which the television is folded.

FIG. 13A is a view showing a state in which the smartphone is unfolded; and FIG. 13B is a view showing a state in which the smartphone is folded. Although the electronic devices are shown as being folded in a vertical direction, the present invention is not limited thereto. For example, the electronic device may be configured to be folded in a horizontal direction.

The present inventive concept may be applied to a display device and an electronic device including the display device. For example, the present inventive concept may be applied to any of a cellular phone, a smartphone, a video phone, a smart pad, a smart watch, a tablet PC, a car navigation system, a television, a computer monitor, a laptop, a head mounted display, etc.

The foregoing is illustrative of the inventive concept and is not to be construed as limiting thereof. Although a few example embodiments of the inventive concept have been described, those skilled in the art will readily appreciate that many modifications are possible in the example embodiments without materially departing from the novel teachings and advantages of the inventive concept. Accordingly, all such modifications are intended to be included within the scope of the inventive concept as set forth in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific example embodiments disclosed, and that modifications to the disclosed example embodiments, as well as other example embodiments, are intended to be included within the scope of the appended claims. The inventive concept is set forth in the following claims, with equivalents of the claims to be included therein.

What is claimed is:

1. A display apparatus, comprising: a flexible display panel comprising a first display area, a second display area spaced apart from the first display area, and a folding area between the first display area and the second display area; a first supporting part under the flexible display panel corresponding to the first display area; a second supporting part under the flexible display panel corresponding to the second display area; and a first adhesive layer between the flexible display panel and the first and second supporting parts, arranged continuously along the folding area from the first display area to the second display area, and wherein a substantially entire portion of the first adhesive layer is covered by the first and second supporting parts when the flexible display panel is unfolded, wherein the first supporting part is separated from and spaced apart from the second supporting part and the first adhesive layer located on the folding area when the flexible display panel is folded.

2. The display apparatus of claim 1, wherein the first adhesive layer comprises one adhesive sheet corresponding to the first display area, the folding area, and the second display area of the flexible display panel.

3. The display apparatus of claim 2, wherein an upper surface of the first supporting part comprises a first non-attachment area which is not bonded to the first adhesive layer, and an upper surface of the second supporting part comprises a second non-attachment area which is not bonded to the first adhesive layer.

4. The display apparatus of claim 3, wherein the first and second non-attachment areas are formed by surface treatment on the upper surfaces of the first and second supporting parts.

5. The display apparatus of claim 4, wherein the surface treatment comprises olefin treatment, silicon treatment, long chain alkyl treatment, or fluorine treatment.

6. The display apparatus of claim 3, wherein a first recess is formed at the first supporting part in the first non-attachment area, and a first non-attachment part is received in the first recess, a second recess is formed at the second supporting part in the second non-attachment area, and a second non-attachment part is received in the second recess, the upper surface of the first supporting part and an upper surface of the first non-attachment part are on a same plane, and the upper surface of the second supporting part and an upper surface of the second non-attachment part are on a same plane.

7. The display apparatus of claim 2, wherein a portion of the first adhesive layer corresponding to the folding area of the flexible display panel has a lower adhesive force than a portion of the first adhesive layer corresponding to the first or second display areas.

8. The display apparatus of claim 7, wherein the first adhesive layer comprises a pressure sensitive adhesive sheet comprising a UV-reactive agent.

9. The display apparatus of claim 1, wherein an image is displayed in both the first display area, the second display area, and the folded folding area, and the folding area is foldable.

10. The display apparatus of claim 9, wherein the first adhesive layer corresponding to the folded folding area is spaced apart from the first and second supporting parts when the flexible display panel is folded.

11. The display apparatus of claim 1, further comprising a non-attachment supporting part arranged corresponding to the folding area, and
wherein the first supporting part and the second supporting part are arranged corresponding to the first display area and the second display area, respectively,
the non-attachment supporting part contacts the first adhesive layer when the flexible display panel is unfolded, and
the non-attachment supporting part is spaced apart from the first adhesive layer when the flexible display panel is folded.

12. The display apparatus of claim 1, further comprising:
a cushion layer between the first adhesive layer and the flexible display panel; and
a second adhesive layer between the cushion layer and the flexible display panel.

13. The display apparatus of claim 1, wherein the first adhesive layer comprises an adhesive having an elongation percentage of 100% to 1,000%.

14. A display apparatus, comprising: a flexible display panel which is foldable; a first supporting part attached to the flexible display panel; a second supporting part which is attached to the flexible display panel and is movable relative to the first supporting part as the flexible display panel is folded; and a first adhesive layer between the flexible display panel and the first and second supporting parts and arranged continuously along a folding area between a first display area and a second display area of the flexible display panel, wherein, when the flexible display panel is unfolded, the first and second supporting parts make contact with the first adhesive layer located on the folding area and are not bonded to the first adhesive layer at respective first and second non-attachment areas, wherein the first supporting part is separated from and spaced apart from the second supporting part and the first adhesive layer located on the folding area when the flexible display panel is folded.

15. The display apparatus of claim 14, wherein
a portion of the first supporting part and a portion of the second supporting part are spaced apart from the first adhesive layer when the flexible display panel is folded.

16. The display apparatus of claim 15, wherein an upper surface of the first supporting part comprises the first non-attachment area which is not bonded to the first adhesive layer, and
an upper surface of the second supporting part comprises the second non-attachment area which is not bonded to the first adhesive layer.

17. The display apparatus of claim 15, wherein a portion of the first adhesive layer corresponding to the portions of the first and second supporting parts spaced apart from the first adhesive layer has a lower adhesive force than other portions of the first adhesive layer.

18. A method of manufacturing a display apparatus, the method comprising: providing first and second supporting parts; providing a flexible display panel comprising a first display area, a second display area which is spaced apart from the first display area, and a folding area between the first display area and the second display area, wherein a first adhesive layer is attached thereon; and attaching the first adhesive layer to upper surfaces of the first and second supporting parts such that the first supporting part is under the flexible display panel corresponding to the first display area, the second supporting part is under the flexible display panel corresponding to the second display area, and the first adhesive layer is between the flexible display panel and the first and second supporting parts, and wherein the first adhesive layer is arranged continuously along the folding area from the first display area to the second display area, wherein a substantially entire portion of the first adhesive layer is covered by the first supporting part and the second supporting part when the flexible display panel is unfolded, and wherein the first supporting part is separated from and spaced apart from the second supporting part and the first adhesive layer located on the folding area when the flexible display panel is folded.

19. The method of claim 18, further comprising:
performing a surface treatment to portions of the upper surfaces of the first and second supporting parts, and
wherein the surface treatment comprises olefin treatment, silicon treatment, long chain alkyl treatment, or fluorine treatment.

20. The method of claim 18, wherein the first adhesive layer comprises a UV-reactive agent, and
the method further comprises irradiating UV light to a portion of the first adhesive layer.

* * * * *